US009897921B2

(12) United States Patent
Bonney

(10) Patent No.: US 9,897,921 B2
(45) Date of Patent: Feb. 20, 2018

(54) COMPOSITIONS COMPRISING MINERAL SPIRITS AND METHODS RELATED THERETO

(71) Applicant: NSX Operating Co. LLC, Atlanta, GA (US)

(72) Inventor: Jon-Eric Bonney, Atlanta, GA (US)

(73) Assignee: NSX Operating Co. LLC, Atlanta, GA (US)

( * ) Notice: Subject to any disclaimer, the term of this patent is extended or adjusted under 35 U.S.C. 154(b) by 0 days.

(21) Appl. No.: 14/832,667

(22) Filed: Aug. 21, 2015

(65) Prior Publication Data
US 2016/0054656 A1 Feb. 25, 2016

Related U.S. Application Data

(60) Provisional application No. 62/041,010, filed on Aug. 22, 2014.

(51) Int. Cl.
G03F 7/32 (2006.01)
G03F 7/30 (2006.01)

(52) U.S. Cl.
CPC ............ G03F 7/325 (2013.01); G03F 7/3092 (2013.01)

(58) Field of Classification Search
CPC ........................................ G03F 7/325
See application file for complete search history.

(56) References Cited

U.S. PATENT DOCUMENTS

| | | | |
|---|---|---|---|
| 4,806,452 A | 2/1989 | Hoffmann et al. | |
| 4,847,182 A | 7/1989 | Worns et al. | |
| 5,049,646 A * | 9/1991 | Tyagi | C08G 63/6854 528/272 |
| 5,077,177 A | 12/1991 | Frass et al. | |
| 5,312,719 A | 5/1994 | Schlosser et al. | |
| 5,578,420 A | 11/1996 | Takagi et al. | |
| 5,863,959 A * | 1/1999 | Heyman | C08F 261/02 521/137 |
| 5,981,787 A * | 11/1999 | Sanchez | C07C 409/38 526/230.5 |
| 6,084,059 A * | 7/2000 | Matsushita | C07F 3/06 502/156 |
| 6,162,593 A | 12/2000 | Wyatt et al. | |
| 6,682,877 B2 | 1/2004 | Wyatt et al. | |
| 2003/0030030 A1* | 2/2003 | Sahbari | G03F 7/426 252/79.1 |
| 2006/0263611 A1* | 11/2006 | Weberg | A47B 77/022 428/443 |
| 2010/0068651 A1* | 3/2010 | Bradford | G03F 7/325 430/306 |
| 2014/0308593 A1* | 10/2014 | Yabe | H01M 12/08 429/405 |
| 2014/0312268 A1* | 10/2014 | Lim | H01M 4/622 252/182.1 |

* cited by examiner

*Primary Examiner* — Chanceity Robinson
(74) *Attorney, Agent, or Firm* — Ballard Spahr LLP

(57) ABSTRACT

This invention relates to a composition comprising mineral spirits in combination with an alcohol or diisopropylbenzene or both, and methods directed to the preparation and use of this composition. This abstract is intended as a scanning tool for purposes of searching in the particular art and is not intended to be limiting of the present invention.

20 Claims, 4 Drawing Sheets

COMPOSITIONS COMPRISING MINERAL SPIRITS AND METHODS RELATED THERETO

CROSS-REFERENCE TO RELATED APPLICATIONS

This application claims the benefit of U.S. Provisional Application No. 62/041,010, filed on Aug. 22, 2014, which is incorporated herein by reference in its entirety.

BACKGROUND

Flexography is a type of relief printing that uses flexible sheets of photopolymer to transfer an image onto a substrate. In the flexography process, photopolymer sheet is exposed to light through a negative or mask that blocks selected portions of the photopolymer from the light. The portions of the photopolymer that are exposed to ultra-violet light crosslink. The non-crosslinked photopolymer is soluble in many organic solvents, whereas the crosslinked photopolymer is harder and much more resistant to chemical solvent attack. By "washing" the selectively-exposed photopolymer sheet in a solvent bath, the unexposed portions of the plate are removed, a process known as developing. The resulting developed plate will contain a raised relief image in those areas where ultra-violet light passed through the negative. The flexible relief plate is wrapped around a cylinder on a printing press, and used to transfer ink onto a substrate, such as paper, film, bags, etc.

While many organic solvents are capable of dissolving non-crosslinked material from the plate, only a few are considered good developer solvents. This is because most solvents that dissolve the non-crosslinked material also absorb into the crosslinked portions of the plate, causing these areas to soften and swell, thus changing the shape of the plate, and swelling encourages erosion of the relief image by the brush in the developer tank. This erosion results in the final image on the plate becoming different from the target image on the negative. Hence printing quality suffers. The ideal developer solvent would dissolve and remove the non-crosslinked portions of the plate while at the same time not softening or swelling the crosslinked portions.

Terpene hydrocarbons such as d-limonene have been used in developer solvents (see, i.e., U.S. Pat. Nos. 4,806,452 and 4,847,182). Terpene hydrocarbons have intense odors, are moderate skin and eye irritants, and have flash points below 141° F., making the waste solvent mixture "hazardous" by RCRA guidelines. This leads to increase disposal cost and high regulatory compliance costs. Additionally, d-limonene is unable to develop plates containing nitrile rubber (U.S. Pat. No. 5,077,177). Mixed aromatic solvents have been used in combination with butanol and 2-ethyl butanol (U.S. Pat. No. 5,312,719). However, these mixed aromatic solvents are relatively toxic and distinctly odoriferous, with low flash points (<141° F.).

Takagi et al. teaches the use of a three-part solvent blend containing mixed aromatic solvents to dissolve the photopolymer, an alcohol to remove the protective "anti-tack resin layer" or cover layer, and isobutyl isobutyrate as an odor masking agent (see, i.e., U.S. Pat. No. 5,578,420). The developer solvent contains 25-70% of mixed aromatic solvents such as Solvesso 150 that have high odor intensity and moderate toxicity. These solvents are so odoriferous that an odor masking agent (isobutyl isobutyrate) is required. Isobutyl isobutyrate has a flash point of only 99° F., classifying it as a flammable liquid. The addition of significant amounts of this solvent to the blend reduces the flash point of the mixture to below 141° F., causing the waste solvent to be classified as a RCRA hazardous waste. Additionally, the isobutyl isobutyrate itself also has a strong, unpleasant odor.

Despite a variety of organic solvents known to develop photopolymer plates, an odorless developing solvent that is easily recyclable has remained elusive. Thus, there remains a need for developing solvents with low odor intensity comprising non-hazardous components.

SUMMARY

In accordance with the purpose(s) of the invention, as embodied and broadly described herein, the invention, in one aspect, relates to compositions comprising mineral spirits, diisopropylbenzene (DIPB), and/or at least one alcohol and methods of making and using same.

Disclosed are compositions comprising mineral spirits and diisopropylbenzene.

Also disclosed are compositions comprising mineral spirits and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof.

Also disclosed are compositions comprising odorless mineral spirits (OMS), diisopropylbenzene, and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof.

Also disclosed are methods for making a disclosed composition.

Also disclosed are methods for making a flexographic printing plate, wherein the method comprises the steps of: (a) image-wise exposing a photosensitive resin on a substrate; (b) washing away unexposed non-crosslinked areas of the photosensitive resin with a solvent solution so as to form a relief pattern of the photosensitive resin on the substrate, wherein the solvent solution comprises a disclosed composition; and drying the flexographic relief printing plate.

Also disclosed are methods for reclaiming a solvent solution, the method comprising: (a) collecting the solvent solution and at least one non-crosslinked portion of a photosensitive resin, wherein the solvent solution comprises a disclosed composition and wherein the solvent solution has been used to treat the photosensitive resin; and (c) separating the non-crosslinked portion from the solvent solution, thereby reclaiming the solvent solution.

Also disclosed are kits comprising a disclosed composition.

Also disclosed are products of the disclosed methods.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying figures, which are incorporated in and constitute a part of this specification, illustrate several aspects and together with the description serve to explain the principles of the invention.

Figure 1A:
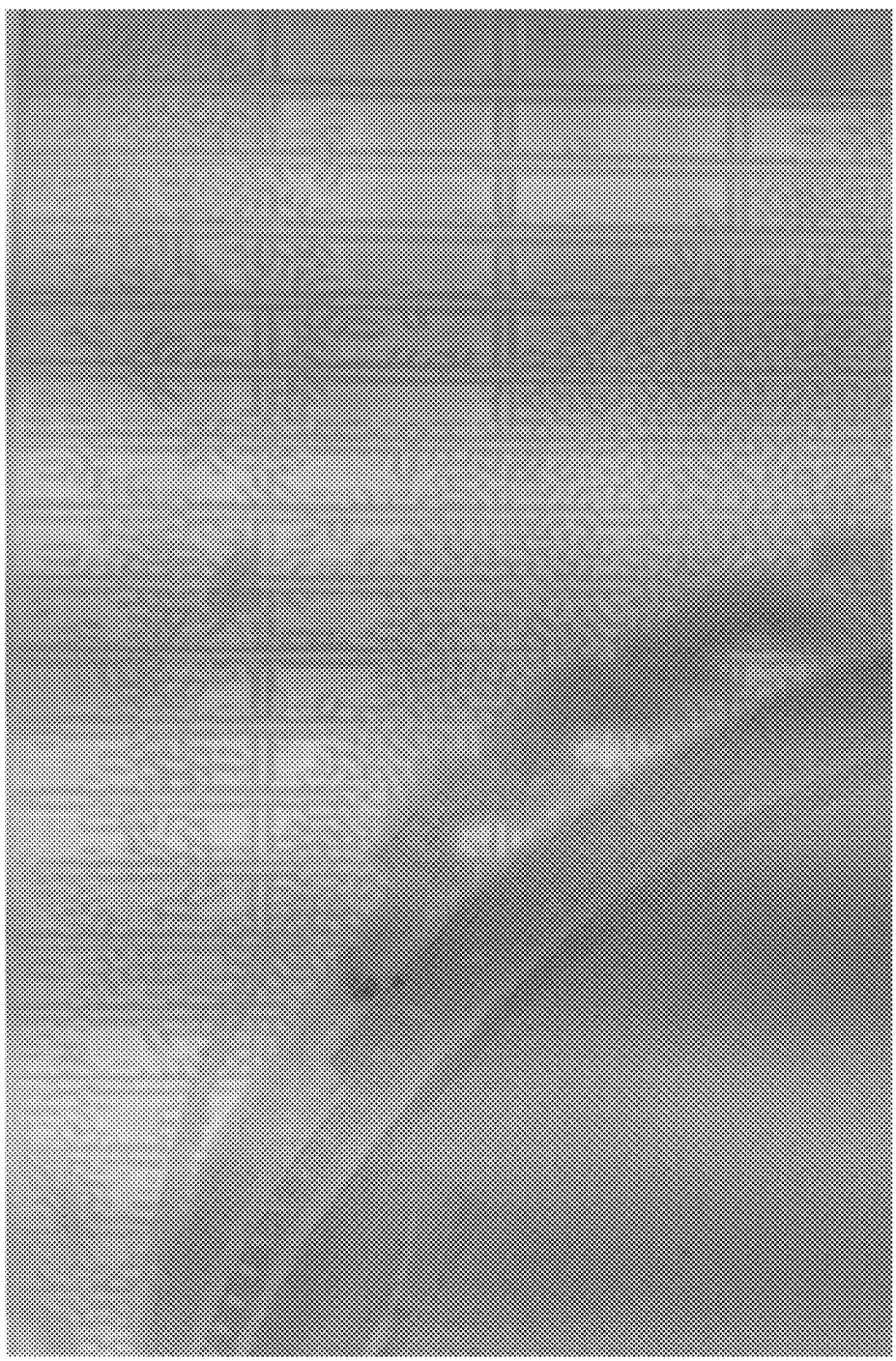
FIG. 1A-E shows representative images of flexographic printing plates prepared using known developing solvents. Known developing solvents often suffer from processing issues (1A and 1B) sometimes caused by uneven wetting (1C-1E), resulting in defective plates.
Figure 1B:
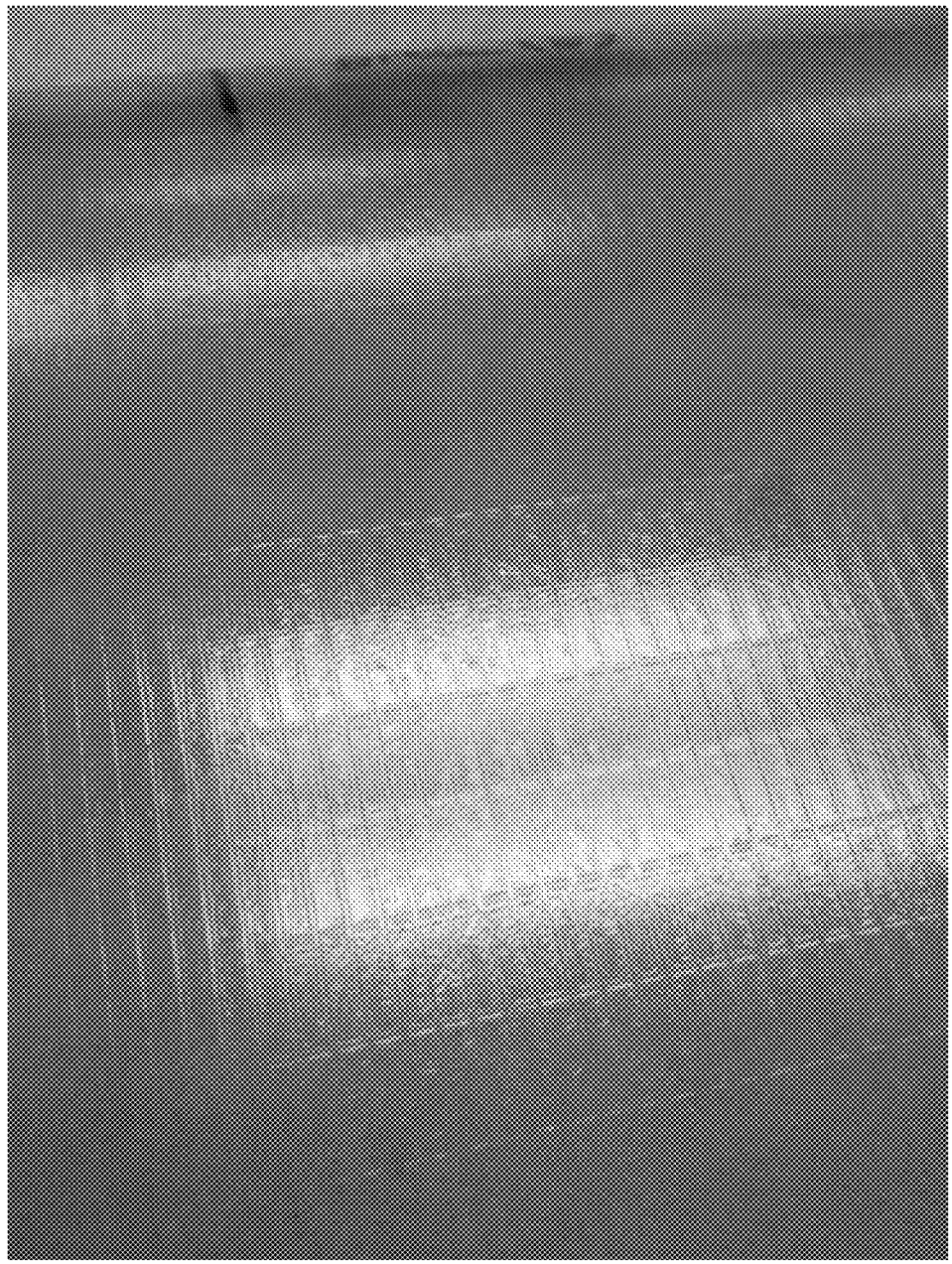
Figure 1C:
Figure 1D:
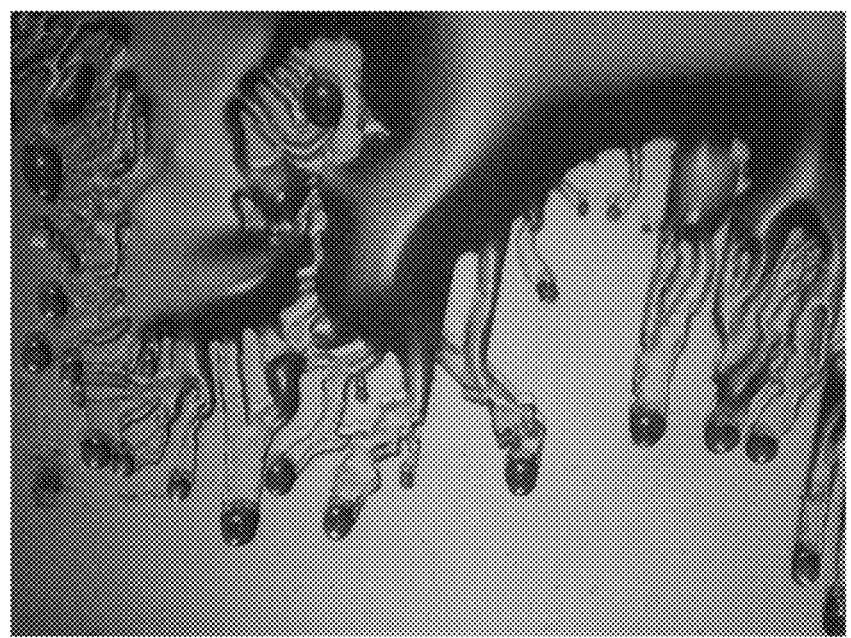
Figure 1E:
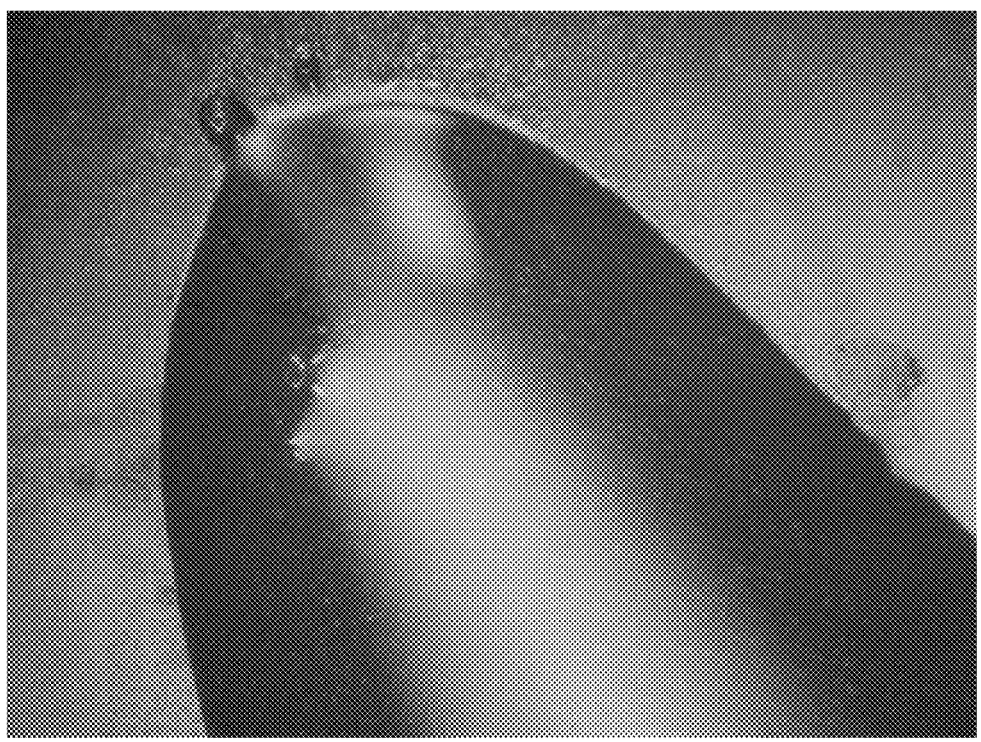

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

While aspects of the present invention can be described and claimed in a particular statutory class, such as the system statutory class, this is for convenience only and one of skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

Throughout this application, various publications are referenced. The disclosures of these publications in their entireties are hereby incorporated by reference into this application in order to more fully describe the state of the art to which this pertains. The references disclosed are also individually and specifically incorporated by reference herein for the material contained in them that is discussed in the sentence in which the reference is relied upon. Nothing herein is to be construed as an admission that the present invention is not entitled to antedate such publication by virtue of prior invention. Further, the dates of publication provided herein may be different from the actual publication dates, which can require independent confirmation.

A. Definitions

As used in the specification and the appended claims, the singular forms "a," "an" and "the" include plural referents unless the context clearly dictates otherwise. Thus, for example, reference to "a functional group," "an alkyl," or "a residue" includes mixtures of two or more such functional groups, alkyls, or residues, and the like.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

As used herein, the terms "optional" or "optionally" means that the subsequently described event or circumstance can or cannot occur, and that the description includes instances where said event or circumstance occurs and instances where it does not.

As used herein, the term "mineral spirits" refers to a petroleum-derived liquid comprising aliphatic and/or aromatic hydrocarbons that is also known as white spirit, mineral turpentine, turpentine substitute, petroleum spirits, solvent naphtha (petroleum), varsol, or Stoddard solvent. Typically, it is a mixture of aliphatic and alicyclic C7 to C12 hydrocarbons with a maximum content of 25% of C7 to C12 aromatic hydrocarbons. In various aspects, mineral spirits comprises no more than about 25 wt % aromatic constituents.

As used herein, the term "odorless mineral spirits" refers to mineral spirits having only a mild odor, or in some instances, no odor. In various aspects, odorless mineral spirits may be mineral spirits that have been further refined, so as to decrease the amount of aromatic constituents that are present.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of embodiments described in the specification.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

B. Compositions Comprising Mineral Spirits

In one aspect, the invention relates to compositions comprising mineral spirits, diisopropylbenzene, and/or at least one alcohol.

In one aspect, the invention relates to compositions comprising mineral spirits and diisopropylbenzene.

In one aspect, the invention relates to compositions comprising mineral spirits at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof.

In one further aspect, the invention relates to compositions comprising odorless mineral spirits, diisopropylbenzene, and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof.

1. Mineral Spirits

In one aspect, the compositions comprise mineral spirits. In a further aspect, the mineral spirits are odorless.

In a further aspect, the mineral spirits have an aromatic content of less than 10 wt %. In a still further aspect, the mineral spirits have an aromatic content of less than 9 wt %. In yet a further aspect, the mineral spirits have an aromatic content of less than 8 wt %. In an even further aspect, the mineral spirits have an aromatic content of less than 7 wt %. In a still further aspect, the mineral spirits have an aromatic content of less than 6 wt %. In yet a further aspect, the mineral spirits have an aromatic content of less than 5 wt %. In an even further aspect, the mineral spirits have an aromatic content of less than 4 wt %. In a still further aspect, the mineral spirits have an aromatic content of less than 3 wt %. In yet a further aspect, the mineral spirits have an aromatic content of less than 2 wt %. In an even further aspect, the mineral spirits have an aromatic content of less than 1 wt %. In a still further aspect, the mineral spirits have an aromatic content of less than 0.5 wt %. In yet a further aspect, the mineral spirits have an aromatic content of less than 0.1 wt %.

In a further aspect, the mineral spirits are present in an amount of from about 25 wt % to about 65 wt %. In a still further aspect, the mineral spirits are present in an amount of from about 35 wt % to about 65 wt %. In yet a further aspect, the mineral spirits are present in an amount of from about 45 wt % to about 65 wt %. In an even further aspect, the mineral spirits are present in an amount of from about 55 wt % to about 65 wt %. In a still further aspect, the mineral spirits are present in an amount of from about 25 wt % to about 65 wt %. In yet a further aspect, the mineral spirits are present in an amount of from about 25 wt % to about 55 wt %. In an even further aspect, the mineral spirits are present in an amount of from about 25 wt % to about 45 wt %. In a still further aspect, the mineral spirits are present in an amount of from about 25 wt % to about 35 wt %.

In a further aspect, the mineral spirits are present in an amount of about 55 wt %. In a still further aspect, the mineral spirits are present in an amount of about 54 wt %. In yet a further aspect, the mineral spirits are present in an amount of about 53 wt %. In an even further aspect, the mineral spirits are present in an amount of about 52 wt %. In a still further aspect, the mineral spirits are present in an amount of about 51 wt %. In yet a further aspect, the mineral spirits are present in an amount of about 50 wt %. In an even further aspect, the mineral spirits are present in an amount of about 49 wt %. In a still further aspect, the mineral spirits are present in an amount of about 48 wt %. In yet a further aspect, the mineral spirits are present in an amount of about 47 wt %. In an even further aspect, the mineral spirits are present in an amount of about 46 wt %. In a still further aspect, the mineral spirits are present in an amount of about 45 wt %.

2. Diisopropylbenzene (DIPB)

In one aspect, the compositions comprise diisopropylbenzene. Diisopropylbenzene is a chemical that is produced as an unwanted byproduct of the cumene manufacturing process, wherein benzene is reacted with propylene to form diisopropylbenzene. Because it is a waste product that is derived from fossil fuels, any new and novel use for diisopropylbenzene may improve the yield of value-added products from the dwindling supply of natural resources.

Diisopropylbenzene is less toxic than other developer solvents, including even natural terpene hydrocarbon solvents (which are often referred to as so-called "safe" solvents). Lastly, solvents containing diisopropylbenzene have a very mild and acceptable odor, making them significantly more pleasant to use than solvents containing lower molecular weight aromatic solvents, terpene derivatives, esters, ketones, or low molecular weight alcohols. This is a significant advantage, as the odor of a strong-smelling developer solvent will often permeate an entire plate-processing facility, making the indoor environment uncomfortable.

The properties of diisopropylbenzene are illustrated in Table 1 below.

TABLE 1

| Property | |
| --- | --- |
| Chemical Names | 1,4-diisopropylbenzene |
| | 1,3-diisopropylbenzene |
| | mixed diisopropylbenzenes |
| Chemical Formula | $C_6H_4[CH(CH_3)_2]_2$=$C_{12}H_{18}$ |
| CAS Numbers (respectively) | 100-18-5 (1,4 DIPB) |
| | 99-62-7 (1,3 DIPB) |
| | 25321-09-9 (mixed DIPB) |
| Flash point | 170° F. (76° C.) |
| Specific Gravity at 60° F. | 0.857 |
| Boiling Point | 210° C. (410° F.) |
| $LD_{50}$ oral rat (RTECS CZ6360000) | 6,300 mg/kg |

In a further aspect, the diisopropylbenzene is present in an amount of from about 10 wt % to about 50 wt %. In a still further aspect, the diisopropylbenzene is present in an amount of from about 20 wt % to about 50 wt %. In yet a further aspect, the diisopropylbenzene is present in an amount of from about 30 wt % to about 50 wt %. In an even further aspect, the diisopropylbenzene is present in an amount of from about 40 wt % to about 50 wt %. In a still further aspect, the diisopropylbenzene is present in an amount of from about 10 wt % to about 40 wt %. In yet a further aspect, the diisopropylbenzene is present in an amount of from about 10 wt % to about 30 wt %. In an even further aspect, the diisopropylbenzene is present in an amount of from about 10 wt % to about 20 wt %.

In a further aspect, the diisopropylbenzene is present in an amount of about 35 wt %. In a still further aspect, the diisopropylbenzene is present in an amount of about 34 wt %. In yet a further aspect, the diisopropylbenzene is present in an amount of about 33 wt %. In an even further aspect, the diisopropylbenzene is present in an amount of about 32 wt %. In a still further aspect, the diisopropylbenzene is present in an amount of about 31 wt %. In yet a further aspect, the diisopropylbenzene is present in an amount of about 30 wt %. In an even further aspect, the diisopropylbenzene is present in an amount of about 29 wt %. In a still further aspect, the diisopropylbenzene is present in an amount of about 28 wt %. In yet a further aspect, the diisopropylbenzene is present in an amount of about 27 wt %. In an even further aspect, the diisopropylbenzene is present in an amount of about 26 wt %. In a still further aspect, the diisopropylbenzene is present in an amount of about 25 wt %.

3. Alcohol

In one aspect, the compositions comprise at least one alcohol. In a further aspect, the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In a still further aspect, the at least one alcohol is benzyl alcohol.

Ideally, the alcohol should be miscible with diisopropylbenzene, have suitable solubility parameters, have suitable toxicity and safety profiles, be readily disposable, and have pleasant odors. These alcohols are used to modify the properties of the composition. This includes the addition of solvents to aid in the removal of the cover layer on the flexographic plate (e.g., tetrahydrofurfuryl alcohol) and/or form an azeotrope (e.g., benzyl alcohol).

In a further aspect, the at least one alcohol is present in an amount of from about 5 wt % to about 35 wt %. In a still further aspect, the at least one alcohol is present in an amount of from about 10 wt % to about 35 wt %. In yet a further aspect, the at least one alcohol is present in an amount of from about 15 wt % to about 35 wt %. In an even further aspect, the at least one alcohol is present in an amount of from about 20 wt % to about 35 wt %. In a still further aspect, the at least one alcohol is present in an amount of from about 25 wt % to about 35 wt %.

In a further aspect, the at least one alcohol is present in an amount of about 25 wt %. In a still further aspect, the at least one alcohol is present in an amount of about 24 wt %. In yet a further aspect, the at least one alcohol is present in an amount of about 23 wt %. In an even further aspect, the at least one alcohol is present in an amount of about 22 wt %. In a still further aspect, the at least one alcohol is present in an amount of about 21 wt %. In yet a further aspect, the at least one alcohol is present in an amount of about 20 wt %. In an even further aspect, the at least one alcohol is present in an amount of about 19 wt %. In a still further aspect, the at least one alcohol is present in an amount of about 18 wt %. In yet a further aspect, the at least one alcohol is present in an amount of about 17 wt %. In an even further aspect, the at least one alcohol is present in an amount of about 16 wt %. In a still further aspect, the at least one alcohol is present in an amount of about 15 wt %.

4. Additional Components

In one aspect, the composition further comprises dihydromercynol.

In further aspect, the dihydromercynol is present in an amount of from about 0.1 wt % to about 5 wt %. In a still further aspect, the dihydromercynol is present in an amount of from about 0.5 wt % to about 5 wt %. In yet a further aspect, the dihydromercynol is present in an amount of from about 1 wt % to about 5 wt %. In an even further aspect, the dihydromercynol is present in an amount of from about 3 wt % to about 5 wt %. In a still further aspect, the dihydromercynol is present in an amount of from about 0.1 wt % to about 3 wt %. In yet a further aspect, the dihydromercynol is present in an amount of from about 0.1 wt % to about 1 wt %. In an even further aspect, the dihydromercynol is present in an amount of from about 0.1 wt % to about 0.5 wt %.

In one aspect, the invention further comprises pine oil. In a further aspect, the pine oil comprises at least one alcohol in an amount of from about 60 wt % to about 90 wt %. In a still further aspect, the pine oil comprises at least one alcohol in an amount of from about 70 wt % to about 90 wt %. In yet a further aspect, the pine oil comprises at least one alcohol in an amount of from about 80 wt % to about 90 wt %. In an even further aspect, the pine oil comprises at least one alcohol in an amount of from about 60 wt % to about 80 wt %. In a still further aspect, the pine oil comprises at least one alcohol in an amount of from about 60 wt % to about 70 wt %.

In a further aspect, the pine oil is present in an amount of from about 0.1 wt % to about 5 wt %. In a still further aspect, the pine oil is present in an amount of from about 0.5 wt % to about 5 wt %. In yet a further aspect, the pine oil is present in an amount of from about 1 wt % to about 5 wt %. In an even further aspect, the pine oil is present in an amount of from about 3 wt % to about 5 wt %. In a still further aspect, the pine oil is present in an amount of from about 0.1 wt % to about 3 wt %. In yet a further aspect, the pine oil is present in an amount of from about 0.1 wt % to about 1 wt %. In an even further aspect, the pine oil is present in an amount of from about 0.1 wt % to about 0.5 wt %.

In various aspects, the composition may further comprise an additional component.

C. Methods For Making A Solvent Solution

In one aspect, the invention relates to methods for making a disclosed composition.

Thus, in a further aspect, the invention relates to a method for making a solvent solution, the method comprising: (a) providing mineral spirits; and (b) combining with diisopropylbenzene, thereby making the solvent solution. In a still further aspect, the mineral spirits are odorless.

In a further aspect, the method further comprises combining with at least one alcohol. In a still further aspect, the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In yet a further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In an even further aspect, the at least one alcohol is benzyl alcohol.

In a further aspect, the invention relates to a method for making a solvent solution, the method comprising: (a) providing mineral spirits; and (b) combining with at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof, thereby making the solvent solution. In a still further aspect, the mineral spirits are odorless. In yet a further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In an even further aspect, the at least one alcohol is benzyl alcohol.

In a further aspect, the method further comprises combining with diisopropylbenzene.

In a further aspect, the invention relates to a method for making a solvent solution, the method comprising: (a) providing odorless mineral spirits; (b) combining with diisopropylbenzene; and (c) combining with at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof, thereby making the solvent solution. In a still further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In yet a further aspect, the at least one alcohol is benzyl alcohol.

In a further aspect, the method further comprises combining with dihydromercynol.

In a further aspect, the method further comprises combining with pine oil. In a still further aspect, the pine oil comprises at least one alcohol in an amount of from about 60 wt % to about 90 wt %. In yet a further aspect, the pine oil comprises at least one alcohol in an amount of from about 70 wt % to about 90 wt %. In an even further aspect, the pine oil comprises at least one alcohol in an amount of from about 80 wt % to about 90 wt %. In a still further aspect, the pine oil comprises at least one alcohol in an amount of from about 60 wt % to about 80 wt %. In yet a further aspect, the pine oil comprises at least one alcohol in an amount of from about 60 wt % to about 70 wt %.

D. Methods For Making A Flexographic Printing Plate

In one aspect, the invention relates to methods for making a flexographic printing plate, wherein the method comprises the steps of: (a) image-wise exposing a photosensitive resin on a substrate; (b) washing away unexposed non-crosslinked areas of the photosensitive resin with a solvent solution so as to form a relief pattern of the photosensitive resin on the substrate, wherein the solvent solution comprises mineral spirits and diisopropylbenzene; and (c) drying the flexographic relief printing plate.

In one aspect, the invention relates to methods for making a flexographic printing plate, wherein the method comprises the steps of: (a) image-wise exposing a photosensitive resin on a substrate; (b) washing away unexposed non-crosslinked areas of the photosensitive resin with a solvent solution so as to form a relief pattern of the photosensitive resin on the substrate, wherein the solvent solution comprises mineral spirits and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof; and (c) drying the flexographic relief printing plate.

In one aspect, the invention relates to methods for making a flexographic printing plate, wherein the method comprises the steps of: (a) image-wise exposing a photosensitive resin on a substrate; (b) washing away unexposed non-crosslinked areas of the photosensitive resin with a solvent solution so as to form a relief pattern of the photosensitive resin on the substrate, wherein the solvent solution comprises odorless mineral spirits, diisopropylbenzene and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof; and (c) drying the flexographic relief printing plate.

In a further aspect, the mineral spirits are odorless.

In various aspects, the disclosed solvent solution may offer several advantages over other developing solvents. For example, the use of the disclosed solvent solution may reduce the drying time by up to 10%, up to 20%, up to 30%, up to 40%, up to 50%, up to 60%, or up to 70%. The reduction in drying time, in turn, may allow less time for the cured polymer to become impregnated with the solvent molecules. Thus, an additional advantage of the disclosed solvent solution may be less plate swelling. The amount of plate swelling may be reduced by from about 5% to about 50%, from about 5% to about 45%, from about 5% to about 35%, from about 5% to about 25%, from about 5% to about 15%, from about 15% to about 50%, from about 25% to about 50%, or from about 35% to about 50%. Additional advantages may include lower VOC emissions (no heat required) and a mild or low odor.

In a further aspect, the solvent solution further comprises at least one alcohol. In a still further aspect, the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In yet a further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In an even further aspect, the at least one alcohol is benzyl alcohol.

In a further aspect, the solvent solution further comprises diisopropylbenzene.

In a further aspect, the method further comprises reclaiming the solvent solution. In a still further aspect, reclaiming is via distillation. In yet a further aspect, the solvent solution is azeotropic.

In a further aspect, the solvent solution produces less than 15% swelling in a crosslinked photopolymer after exposure to the solvent solution for a period of time sufficient to develop the substrate. In a still further aspect, the solvent solution produces less than 10% swelling in a crosslinked photopolymer after exposure to the solvent solution for a period of time sufficient to develop the substrate. In yet a further aspect, the solvent solution produces less than 8% swelling in a crosslinked photopolymer after exposure to the solvent solution for a period of time sufficient to develop the substrate. In an even further aspect, the solvent solution produces less than 6% swelling in a crosslinked photopolymer after exposure to the solvent solution for a period of time sufficient to develop the substrate. In a still further aspect, the solvent solution produces less than 4% swelling in a crosslinked photopolymer after exposure to the solvent solution for a period of time sufficient to develop the substrate. In yet a further aspect, the solvent solution produces less than 2% swelling in a crosslinked photopolymer after exposure to the solvent solution for a period of time sufficient to develop the substrate.

In a further aspect, the solvent solution has a boiling point of less than 250° C. In a still further aspect, the solvent solution has a boiling point of less than 210° C. In yet a further aspect, the solvent solution has a boiling point of less than 170° C. In an even further aspect, the solvent solution has a boiling point of less than 150° C. In a still further aspect, the solvent solution has a boiling point of less than 110° C. In yet a further aspect, the solvent solution has a boiling point of less than 70° C. In an even further aspect, the solvent solution has a boiling point of less than 50° C.

In a further aspect, the solvent solution has a flash point of at least about 141° F. In a still further aspect, the solvent solution has a flash point of at least about 131° F. In yet a further aspect, the solvent solution has a flash point of at least about 121° F. In an even further aspect, the solvent solution has a flash point of at least about 111° F. In a still further aspect, the solvent solution has a flash point of at least about 101° F. In yet a further aspect, the solvent solution has a flash point of at least about 91° F. In an even further aspect, the solvent solution has a flash point of at least about 81° F. In a still further aspect, the solvent solution has a flash point of at least about 71° F.

E. Methods For Reclaiming A Solvent Solution

In one aspect, the invention relates to methods for reclaiming a solvent solution, the method comprising: (a) collecting the solvent solution and at least one non-crosslinked portion of a photosensitive resin, wherein the solvent solution comprises mineral spirits and diisopropylbenzene and wherein the solvent solution has been used to treat the photosensitive resin; and (b) separating the non-crosslinked portion from the solvent solution, thereby reclaiming the solvent solution.

In one aspect, the invention relates to methods for reclaiming a solvent solution, the method comprising: (a) collecting the solvent solution and at least one non-crosslinked portion of a photosensitive resin, wherein the solvent solution comprises mineral spirits and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof and wherein the solvent solution has been used to treat the photosensitive resin; and (b) separating the non-crosslinked portion from the solvent solution, thereby reclaiming the solvent solution.

In one aspect, the invention relates to methods for reclaiming a solvent solution, the method comprising: (a) collecting the solvent solution and at least one non-crosslinked portion of a photosensitive resin, wherein the solvent solution comprises odorless mineral spirits, diisopropylbenzene, and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof and wherein the solvent solution has been used to treat the photosensitive resin; and (b) separating the non-crosslinked portion from the solvent solution, thereby reclaiming the solvent solution.

In a further aspect, the mineral spirits are odorless.

In a further aspect, the solvent solution further comprises at least one alcohol. In a still further aspect, the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In yet a further aspect, the at least one alcohol is selected from tetrahydrofurfuryl alcohol, 2-ethoxyethanol, benzyl alcohol, terpineol, cyclohexanol, methyl cyclohexanol, heptyl alcohol, dipropylene glycol methyl ether, 2-butoxyethanol, and 2-(2-butoxyethoxy) ethanol, or a mixture thereof. In an even further aspect, the at least one alcohol is benzyl alcohol.

In a further aspect, the solvent solution further comprises diisopropylbenzene.

F. Kits

In one aspect, the invention relates to kits comprising mineral spirits, diisopropylbenzene, and/or at least one alcohol. In a further aspect, the invention relates to kits comprising mineral spirits and diisopropylbenzene. In a still further aspect, the invention relates to kits comprising mineral spirits at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof. In yet a further aspect, the invention relates to kits comprising odorless mineral spirits, diisopropylbenzene, and at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, dipropylene glycol methyl ether, 2-butoxyethanol, and 2-(2-butoxyethoxy) ethanol, or a mixture thereof.

In a further aspect, the mineral spirits and the diisopropylbenzene are co-packaged. In a still further aspect, the mineral spirits and the at least one alcohol are co-packaged. In yet a further aspect, the diisopropylbenzene and the at least one alcohol are co-packaged. In an even further aspect, the mineral spirits, the diisopropylbenzene, and the at least one alcohol are co-packaged.

G. Examples

The following examples are put forth so as to provide those of ordinary skill in the art with a complete disclosure and description of how the compositions and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Preparation of the Developing Solvent

Formulations for developing solvents are shown in Table 2.

TABLE 2

| Formulation | OMS (wt %) | DIPB (wt %) | Benzyl Alcohol (wt %) | Dihydromercynol (wt %) | Pine oil 85% (wt %) |
|---|---|---|---|---|---|
| 1 | 36 | 37 | 24 | 3 | — |
| 2 | 49 | 28 | 20 | 3 | — |
| 3 | 55 | 26 | 16 | 3 | — |
| 4 | 36 | 37 | 24 | — | 3 |
| 5 | 49 | 28 | 20 | — | 3 |
| 6 | 55 | 26 | 16 | — | 3 |
| 7 | 37 | 38 | 25 | — | — |
| 8 | 50 | 29 | 21 | — | — |
| 9 | 60 | 40 | — | — | — |
| 10 | 67 | 33 | — | — | — |
| 11 | 60 | — | 40 | — | — |
| 12 | 67 | — | 33 | — | — |

2. Polymer Wash Test

A commercially available 0.045" to 0.250" thick flexographic printing plate was first exposed from the back using a UV light source to form the crosslinked polymer floor of the printing plate. The back exposure was for 15 seconds, which is enough to give a floor thickness of 0.022" to 0.125" (half of the total plate thickness). Next, the top of the plate was exposed to a UV light source through a negative for 10 minutes in the exposure unit. The exposed plate was then developed by immersion (with inline brushing) in a mixture of 49% OMS, 28% diisopropylbenzene, and 20% benzyl alcohol in the developer section of the Platemaker at a temperature of 76° C. The development process was continued until the plate floor (formed by the back exposure) was reached. The time required to reach the plate floor is the Wash Time as indicated in Tables 3-5. The developed plate was then dried in a plate dryer temperature controlled laboratory oven at 140° C. until it returned to its original thickness, which is an indication that all absorbed solvent has been removed and the plate is ready to print. The time required for this part of the process is recorded as Dry Time in Table 3-5. After drying, the developed plate was examined with a microscope to determine the quality of the plate, with particular attention given to the sharpness of the dot structures, the shoulder structure on the relief image and the overall appearance of the plate.

The results of the raw polymer wash test, cylosol wash times are shown in Table 3.

TABLE 3

| Plate Type and Thickness | Wash Time (seconds) | Temp. (° F.) | Depth (fraction of an inch) | Dry Time in Use (min.) | Wash & Dry (min.) |
|---|---|---|---|---|---|
| ACE .045 | 230 | 96.8 | .008 | 90 | 93.83 |
| MAX .045 | 230 | " | .114 | 90 | 93.83 |
| ACE .067 | 270 | " | .035 | 90 | 94.50 |
| DSH .067 | 270 | " | .027 | 90 | 94.50 |
| DPR .067 | 270 | " | .027 | 90 | 94.50 |
| DPL .067 | 270 | " | .036 | 90 | 94.50 |
| RAVE .067 | 270 | " | .022 | 90 | 94.50 |
| NX .067 | 225 | " | .037 | 90 | 93.75 |
| ACE .107 | 350 | " | .054 | 90 | 95.83 |
| RAVE .107 | 350 | " | .057 | 90 | 95.83 |
| DSH .107 | 350 | " |  | 90 | 95.83 |
| DPC .155 | 865 | " |  |  |  |
| DPC .155 | 865 | " |  |  |  |
| FRC D .250 | 1250 | " | .137 | 120 | 140.83 |
| DRC .250 | 1250 | " | .133 | 120 | 140.83 |

The results of the polymer wash test, national OMS test are shown in Table 4.

TABLE 4

| Plate Type and Thickness | Wash Time (seconds) | Temp. (° F.) | Depth (fraction of an inch) | Estimated Dry Time (Caliper) |
|---|---|---|---|---|
| ACE .045 | 230 | 77 | .007 | 65 |
| MAX .045 | 230 | " | .010 | 65 |
| ACE .067 | 270 | " | .027 | 75 |
| DSH .067 | 270 | " | .018 | 75 |
| DPR .067 | 270 | " | .018 | 65 |
| DPL .067 | 270 | " | .015 | 65 |
| RAVE .067 | 270 | " | .015 | 65 |
| NX .067 | 225 | " | .031 | 65 |
| ACE .107 | 350 | " | .051 | 75 |
| RAVE .107 | 350 | " | .053 | 75 |
| DSH .107 | 350 | " | .050 | 75 |
| DPC .155 | 865 | " | .022 | 90 |
| DPC .155 | 865 | " | .056 | 90 |
| FRC D .250 | 1250 | " | .103 | 120 |
| DRC .250 | 1250 | " | .101 | 120 |

The results of the refined wash, national OMS are shown in Table 5.

TABLE 5

| Plate Type and Thickness | Wash Time (seconds) | Depth (fraction of an inch) | Measured Dry Time (min.) | Wash & Dry (min.) |
|---|---|---|---|---|
| ACE .045 | 210 | .015 | 45 | 210 |
| MAX .045 | 210 | .017 | 45 | 210 |
| ACE .067 | 230 | .023 | 45 | 230 |
| DSH .067 | 230 | .027 |  | 230 |
| DPR .067 | 230 | .028 | 55 | 230 |
| DPL .067 | 230 | .027 | 55 | 230 |
| RAVE .067 | 230 | .026 | 45 | 230 |
| NX .067 | 220 |  |  | 220 |
| ACE .107 | 320 | .059 |  | 320 |
| RAVE .107 | 320 | .057 | 55 | 320 |
| DSH .107 | 320 |  |  | 320 |
| DPC .155 | 550 | .061 |  | 550 |
| DPC .155 | 800 | .065 |  | 800 |
| FRC D .250 | 1150 | .120 | 75 | 1150 |
| DRC .250 | 1150 |  |  | 1150 |

A summary of the time saved per plate is illustrated in Table 6.

TABLE 6

| Plate Type and Thickness | Time Saved per Plate (min.) |
|---|---|
| ACE .045 | 45.33 |
| MAX .045 | 45.33 |
| ACE .067 | 45.67 |
| DSH .067 | — |
| DPR .067 | 35.67 |
| DPL .067 | 35.67 |
| RAVE .067 | 45.67 |
| NX .067 | — |
| ACE. 107 | — |
| RAVE. 107 | 35.50 |
| DSH .107 | — |
| DPC .155 | — |
| DPC .155 | — |
| FRC D .250 | 46.66 |
| DRC .250 | — |

3. Results

The use of odorless mineral spirits in combination with DIPB and/or benzyl alcohol results in a near odorless platewash. Previously, developing solvents have relied on costly chemicals such as Isopar L to achieve this goal. The OMS-containing solvent develops plates faster (15-25% reduction), dries faster (up to 50% reduction), produces a better quality image, and produces lower VOC emissions (heat is not necessary). In addition, the OMS formulation helps to prevent polymer build-up on the wash brushes and on other mechanical components exposed to the dissolved polymer. This results in a cleaner plate processor. Finally, the low cost of OMS makes these solvents extremely cost efficient.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A composition comprising:
   (a) odorless mineral spirits;
   (b) diisopropylbenzene; and
   (c) at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, 2-butoxyethanol, and 2-(2-butoxyethoxy) ethanol,
   wherein dipropylene glycol methyl ether is absent.

2. The composition of claim 1, wherein the at least one alcohol is benzyl alcohol.

3. The composition of claim 1, wherein the at least one alcohol is present in an amount of about 20 wt %.

4. The composition of claim 1, wherein the mineral spirits are present in an amount of about 49 wt %.

5. The composition of claim 1, wherein the diisopropylbenzene is present in an amount of about 28 wt %.

6. The composition of claim 1, wherein the at least one alcohol is present in an amount of about 20 wt % and the diisopropylbenzene is present in an amount of about 28 wt %.

7. The composition of claim 1, wherein the mineral spirits are present in an amount of about 49 wt % and the at least one alcohol is present in an amount of about 20 wt %.

8. The composition of claim 1, wherein the mineral spirits are present in an amount of about 49 wt % and the diisopropylbenzene is present in an amount of about 28 wt %.

9. The composition of claim 1, wherein the mineral spirits are present in an amount of about 49 wt %, the at least one alcohol is present in an amount of about 20 wt %, and the diisopropylbenzene is present in an amount of about 28 wt %.

10. A composition comprising:
    (a) mineral spirits having an aromatic content of less than 2 wt %;
    (b) diisopropylbenzene; and
    (c) at least one alcohol, wherein the at least one alcohol is selected from tetrahydrofurfuryl alcohol, 2-ethoxyethanol, benzyl alcohol, terpineol, cyclohexanol, methyl cyclohexanol, hexyl alcohol, heptyl alcohol, 2-butoxyethanol, and 2-(2-butoxyethoxy) ethanol,
    wherein dipropylene glycol methyl ether is absent.

11. The composition of claim 10, wherein the mineral spirits have an aromatic content of less than 1 wt %.

12. The composition of claim 10, wherein the mineral spirits have an aromatic content of less than 0.1 wt %.

13. The composition of claim 10, wherein the at least one alcohol is benzyl alcohol.

14. The composition of claim 10, wherein the mineral spirits are present in an amount of about 49 wt %.

15. The composition of claim 10, wherein the at least one alcohol is present in an amount of about 20 wt %.

16. The composition of claim 10, wherein the diisopropylbenzene is present in an amount of about 28 wt %.

17. The composition of claim 10, wherein the mineral spirits are present in an amount of about 49 wt %, the at least one alcohol is present in an amount of about 20 wt %, and the diisopropylbenzene is present in an amount of about 28 wt %.

18. A composition comprising:
    (a) odorless mineral spirits having an aromatic content of less than 1 wt %;
    (b) diisopropylbenzene; and
    (c) at least one alcohol selected from benzyl alcohol and cyclohexanol,
    wherein dipropylene glycol methyl ether is absent.

19. The composition of claim 18, wherein the mineral spirits have an aromatic content of less than 0.1 wt %.

20. The composition of claim 18, wherein the mineral spirits are present in an amount of about 49 wt %, the at least one alcohol is present in an amount of about 20 wt %, and the diisopropylbenzene is present in an amount of about 28 wt %.

* * * * *